United States Patent
Yeh et al.

(10) Patent No.: US 10,912,221 B2
(45) Date of Patent: Feb. 2, 2021

(54) DETACHABLE CARRIER AND RELATED SERVER APPARATUS

(71) Applicant: Wiwynn Corporation, New Taipei (TW)

(72) Inventors: Ping-Sheng Yeh, New Taipei (TW); Ming-Feng Hsieh, New Taipei (TW)

(73) Assignee: Wiwynn Corporation, New Taipei (TW)

( * ) Notice: Subject to any disclaimer, the term of this patent is extended or adjusted under 35 U.S.C. 154(b) by 0 days.

(21) Appl. No.: 16/122,804

(22) Filed: Sep. 5, 2018

(65) Prior Publication Data
US 2019/0373753 A1    Dec. 5, 2019

(30) Foreign Application Priority Data
May 30, 2018 (TW) .............................. 107118493 A

(51) Int. Cl.
| | | |
|---|---|---|
| *H02B 1/01* | (2006.01) | |
| *H05K 7/14* | (2006.01) | |
| *H05K 7/18* | (2006.01) | |
| *H05K 5/02* | (2006.01) | |

(52) U.S. Cl.
CPC ......... *H05K 7/1401* (2013.01); *H05K 5/0204* (2013.01); *H05K 7/1489* (2013.01); *H05K 7/18* (2013.01)

(58) Field of Classification Search
USPC ...................................................... 361/825
See application file for complete search history.

(56) References Cited

U.S. PATENT DOCUMENTS

| | | | | |
|---|---|---|---|---|
| 5,392,192 A * | 2/1995 | Dunn | ...................... | G06F 1/181 |
| | | | | 174/384 |
| 5,683,156 A * | 11/1997 | Chen | ...................... | G06F 1/181 |
| | | | | 312/223.2 |
| 8,550,576 B2 * | 10/2013 | Chen | .................... | H05K 7/1487 |
| | | | | 312/223.2 |
| 8,649,167 B2 * | 2/2014 | Bala | ..................... | G11B 33/128 |
| | | | | 361/679.01 |
| 9,541,968 B2 * | 1/2017 | Chen | ...................... | G06F 1/181 |
| 9,706,678 B1 | 7/2017 | Chen | | |
| 10,356,934 B2 * | 7/2019 | Ni | ........................... | G06F 1/184 |
| 2007/0002532 A1 * | 1/2007 | Chen | ...................... | G06F 1/181 |
| | | | | 361/679.58 |

(Continued)

FOREIGN PATENT DOCUMENTS

| | | |
|---|---|---|
| TW | M472932 U | 2/2014 |
| TW | I577269 B | 4/2017 |

*Primary Examiner* — Hung S. Bui
(74) *Attorney, Agent, or Firm* — Winston Hsu

(57) ABSTRACT

A server apparatus is movably disposed on a rack. The server apparatus includes a base and a plurality of detachable carriers. The base has a baffle, and an accommodating space of the base is divided into several loading regions by the baffle. Each detachable carrier can include a substrate, a first supporter and a second supporter. The substrate has a first region and a second region adjacent to each other. The first supporter is detachably disposed on the first region. The second supporter is disposed adjacent to the first supporter and detachably disposed on the second region. The first supporter and the second supporter are utilized to support several electronic devices.

19 Claims, 17 Drawing Sheets

(56) References Cited

U.S. PATENT DOCUMENTS

2011/0316399 A1\* 12/2011 Chang ................... G06F 1/187
 312/223.2
2013/0215568 A1\* 8/2013 Kumachi ................ G06F 1/16
 361/679.33

\* cited by examiner

DETACHABLE CARRIER AND RELATED SERVER APPARATUS

BACKGROUND OF THE DISCLOSURE

1. Field of the Disclosure

The present disclosure relates to a carrier for installing electronic devices and a related server apparatus, and more particularly, to a detachable carrier capable of individually removing an electronic device or simultaneously removing the electronic devices having the same type or different types via modular design and a related server apparatus.

2. Description of the Prior Art

A conventional server apparatus includes a fence with several grids disposed on a base for forming a plurality of accommodating space. Each accommodating space is used to install a hard disk, and the conventional sever apparatus can assemble a plurality of hard disks with each other. As some of the hard disks are damaged or prepared for replacement, the related hard disks are respectively removed from the corresponding grid of the fence. In addition, dimensions of the accommodating space on the fence are predefined and the grid is only applied to the specially designated hard disk. The conventional server apparatus cannot accommodate the hard disks having different types and has a drawback of complicated operation. Thus, design of a server apparatus capable of assembling and disassembling electronic components having the same type or different types respectively or simultaneously via modular property for adapting to a variable demand of market competition is an important issue in the related mechanical design industry.

SUMMARY OF THE DISCLOSURE

The present disclosure provides a detachable carrier capable of individually removing an electronic device or simultaneously removing the electronic devices having the same type or different types via modular design and a related server apparatus for solving above drawbacks.

According to the claimed disclosure, a detachable carrier includes a substrate, a first supporter and a second supporter. The substrate has a first region and a second region adjacent to each other. The first supporter is detachably disposed on the first region. The second supporter is adjacent to the first supporter and detachably disposed on the second region. The first supporter and the second supporter are configured to respectively support a plurality of electronic devices.

According to the claimed disclosure, the substrate further has a third region disposed under the second region and adjacent to the first region.

According to the claimed disclosure, the first supporter comprises a first wall portion, a second wall portion, a first base portion and a second base portion. A first lateral edge of the first base portion is connected to a bottom edge of the first wall portion. A second lateral edge of the first base portion is connected to a bottom edge of the second wall portion. A first lateral edge of the second base portion is connected to a middle of the first wall portion. A second lateral edge of the second base portion is connected to a middle of the second wall portion.

According to the claimed disclosure, the first base portion and the second base portion respectively includes a constraining slot structure. Some of the electronic devices respectively include a constraining latch. The constraining latch is slidably disposed inside the constraining slot structure, and the foresaid electronic devices are respectively disposed on the first base portion and the second base portion in a detachable manner.

According to the claimed disclosure, the second supporter includes a holding component and an isolating component. The isolating component is disposed on the holding component to form a plurality of accommodating ranges. The other electronic devices are respectively disposed on the plurality of accommodating ranges in a detachable manner.

According to the claimed disclosure, the first supporter includes a guiding pin and a first mounting hole portion. A bridging structure of the holding component includes a guiding slot portion and a second mounting hole portion. The guiding pin is inserted into the guiding slot portion to align the first mounting hole portion with the second mounting hole portion.

According to the claimed disclosure, a lateral edge of the holding component is connected to the first supporter, and the second supporter further includes a shielding component disposed a front edge of the holding component connected to the lateral edge.

According to the claimed disclosure, the second supporter further includes a locking component disposed on a lateral edge of the holding component far from the first supporter and configured to lock the substrate.

According to the claimed disclosure, the holding component includes a constraining slot structure, and the other electronic devices respectively include a constraining latch. The constraining latch is slidably disposed inside the constraining slot structure, and the other electronic devices are respectively disposed on the holding component in a detachable manner.

According to the claimed disclosure, the second supporter includes a holding component and a positioning component. The positioning component is disposed on a lateral edge of the holding component adjacent to the first supporter. The first supporter includes a guiding pin and a first mounting hole portion. The positioning component includes a guiding slot portion and a second mounting hole portion. The guiding pin is inserted into the guiding slot portion to align the first mounting hole portion with the second mounting hole portion.

According to the claimed disclosure, the second supporter further includes a bracket, an axle and a latching component. The bracket is disposed on the holding component, and the latching component is rotatably disposed on the bracket via the axle.

According to the claimed disclosure, the latching component includes a clipping portion configured to clip a first stretching portion of the holding component and a second stretching portion of the electronic device for constraining a movement of the electronic device relative to the holding component.

According to the claimed disclosure, the substrate further includes a main body and a hooking component. The main body contains the first region and the second region. The hooking component is rotatably disposed on the main body. The hooking component is hooked with a base of a server apparatus for constraint when the detachable carrier is disposed on the base.

According to the claimed disclosure, the substrate further includes a second engaging structure and a first penetrating hole structure. The second engaging structure is disposed on the first region, and the first penetrating hole structure is disposed on a front edge of a main body of the substrate. The first supporter includes a first engaging structure configured to movably engage with the second engaging structure for disposing the first supporter on the first region in a detachable manner. The second supporter includes a second penetrating hole structure configured to assemble with the first penetrating hole structure via a fixing component for disposing the second supporter on the second region in a detachable manner.

According to the claimed disclosure, a server apparatus is movably disposed on a rack and includes a base and a plurality of detachable carriers. The base has a baffle, and an accommodating space of the base is divided into a plurality of carrying areas via the baffle. The plurality of detachable carriers is respectively disposed on the plurality of carrying areas. Each detachable carrier includes a substrate, a first supporter and a first supporter. The substrate has a first region and a second region adjacent to each other. The substrate includes a second engaging structure and a first penetrating hole structure. The second engaging structure is disposed on the first region, and the first penetrating hole structure is disposed on a front edge of a main body of the substrate. The first supporter includes a first engaging structure configured to movably engage with the second engaging structure for disposing the first supporter on the first region in a detachable manner. The second supporter is adjacent to the first supporter. The second supporter includes a second penetrating hole structure configured to assemble with the first penetrating hole structure via a fixing component for disposing the second supporter on the second region in the detachable manner. The first supporter and the second supporter are configured to respectively support a plurality of electronic devices.

The server apparatus of the present disclosure can replace the designated electronic device easily and conveniently. The plurality of detachable carriers can be disposed on the base of the server apparatus via a slide rail structure or a buckling structure. The detachable carrier can accommodate the electronic devices having the same type or different types. The user can remove the detachable carrier for replacing all of the electronic devices disposed on the removed detachable carrier, or can remove one or some electronic devices from the detachable carrier without disassembling the detachable carrier from the base. The detachable carrier can accommodate the electronic devices having the same type, such as the hard disks, or can accommodate the electronic devices having different types, such as the hard disks and the interface card. The substrate and the first supporter of the detachable carrier can be the same structure used to install the hard disk in the first embodiment and the second embodiment, and the second supporter of the detachable carrier used to install the hard disk or the interface card may have structural difference between the first embodiment and the second embodiment.

These and other objectives of the present disclosure will no doubt become obvious to those of ordinary skill in the art after reading the following detailed description of the preferred embodiment that is illustrated in the various figures and drawings.

DETAILED DESCRIPTION

Figure 1:
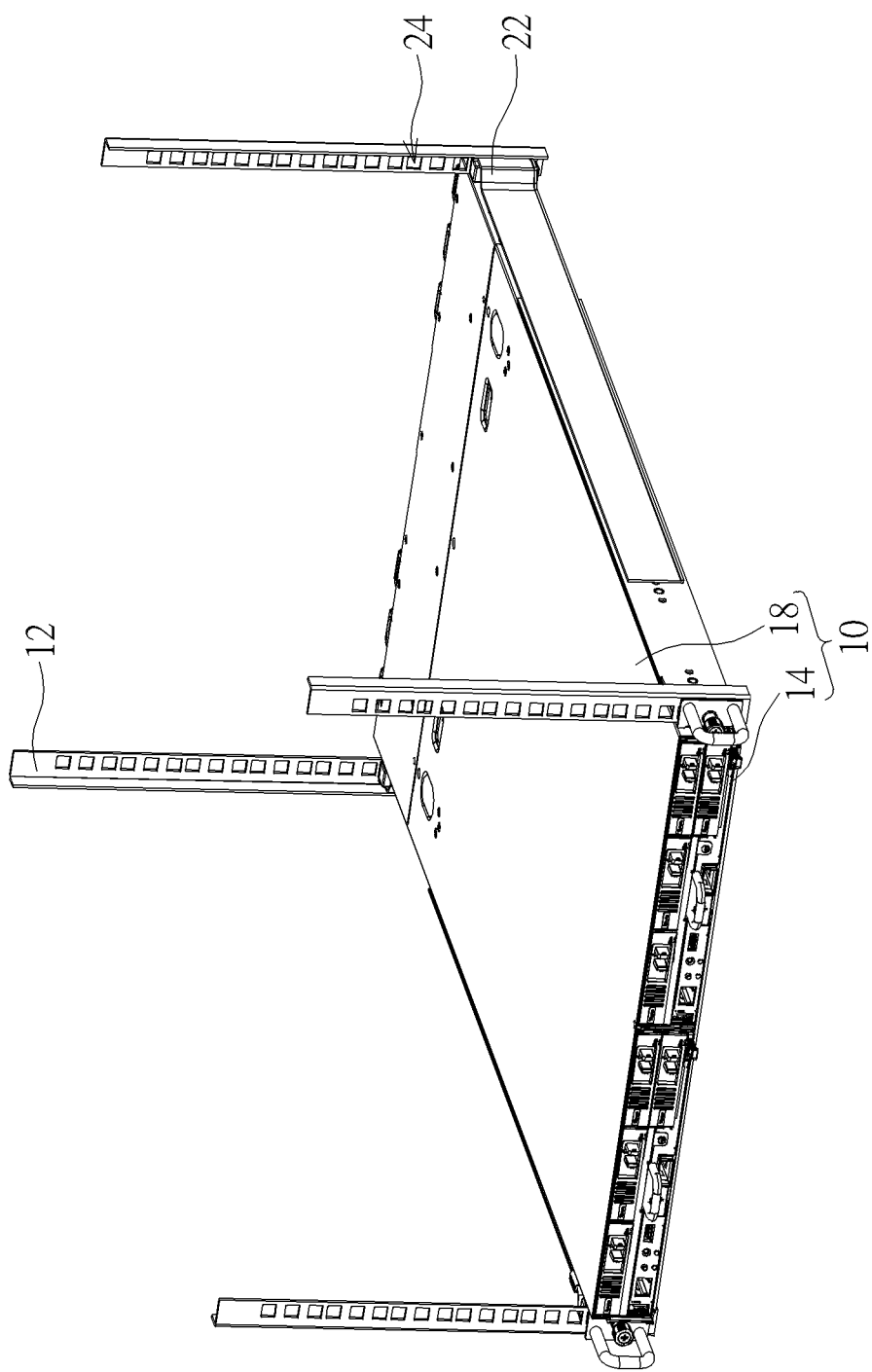
FIG. 1 is an assembly diagram of a server apparatus according to an embodiment of the present disclosure.
Figure 2:
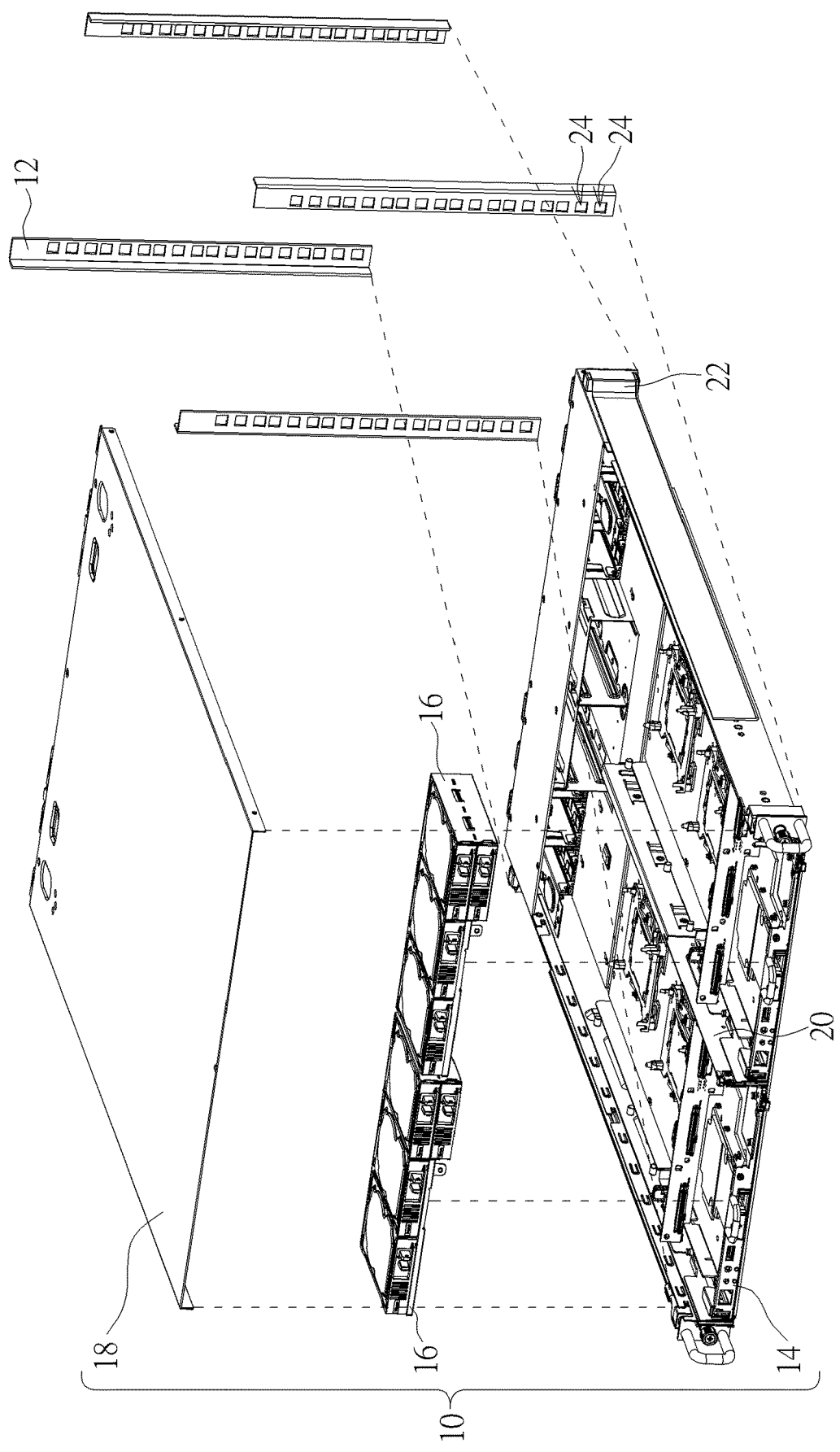
FIG. 2 is an exploded diagram of the server apparatus according to the embodiment of the present disclosure.

Please refer to FIG. 1 and FIG. 2. FIG. 1 is an assembly diagram of a server apparatus 10 according to an embodiment of the present disclosure. FIG. 2 is an exploded diagram of the server apparatus 10 according to the embodiment of the present disclosure. The server apparatus 10 can be movably disposed on a rack 12, and a plurality of server apparatuses 10 may be stacked up inside the rack 12. The server apparatus 10 can include a base 14, several detachable carriers 16 and a cover 18. A baffle 20 is disposed inside the base 14 and configured to divide an accommodating space of the base 14 into a plurality of carrying areas. The detachable carrier 16 can be installed inside the carrying area according to actual demand. Amounts of the carrying area and the detachable carrier 16 are not limited to the embodiment shown in the figures, which depend on design demand.

Each server apparatus 10 can accommodate a plurality of detachable carriers 16. The plurality of detachable carriers 16 may be disposed inside the carrying area in a lateral direction or in a vertical direction, or can be disposed inside the carrying area simultaneously in the lateral direction and the vertical direction. In this embodiment, the detachable carriers 16 are disposed in the lateral direction so that the server apparatus 10 can be a single-layer apparatus. When the detachable carriers 16 are stacked up in the vertical direction, a thickness of the server apparatus 10 can be increased to accommodate the stacked-up detachable carriers 16. The server apparatus 10 can be fixed on a locking hole 24 formed on the rack 12 via a fastening component 22. The thickness of the server apparatus 10 is not limited to the embodiment shown in FIG. 1 and FIG. 2. Any server apparatus 10 capable of being fixed on the corresponding locking hole 24 of the rack 12 via the fastening component 22 belongs to a scope of the present disclosure.

Figure 3:
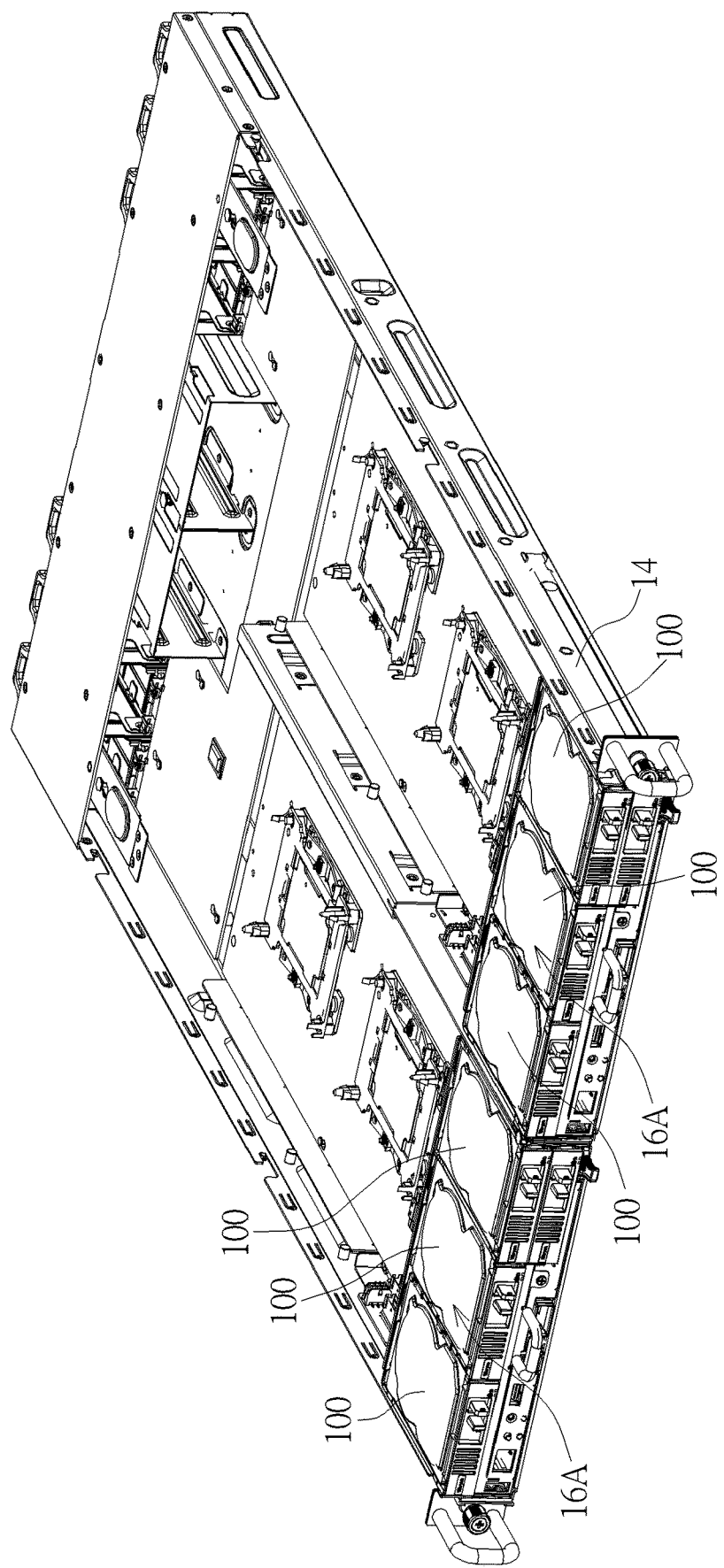
FIG. 3 is a diagram of a detachable carrier according to a first embodiment of the present disclosure.
Figure 4:
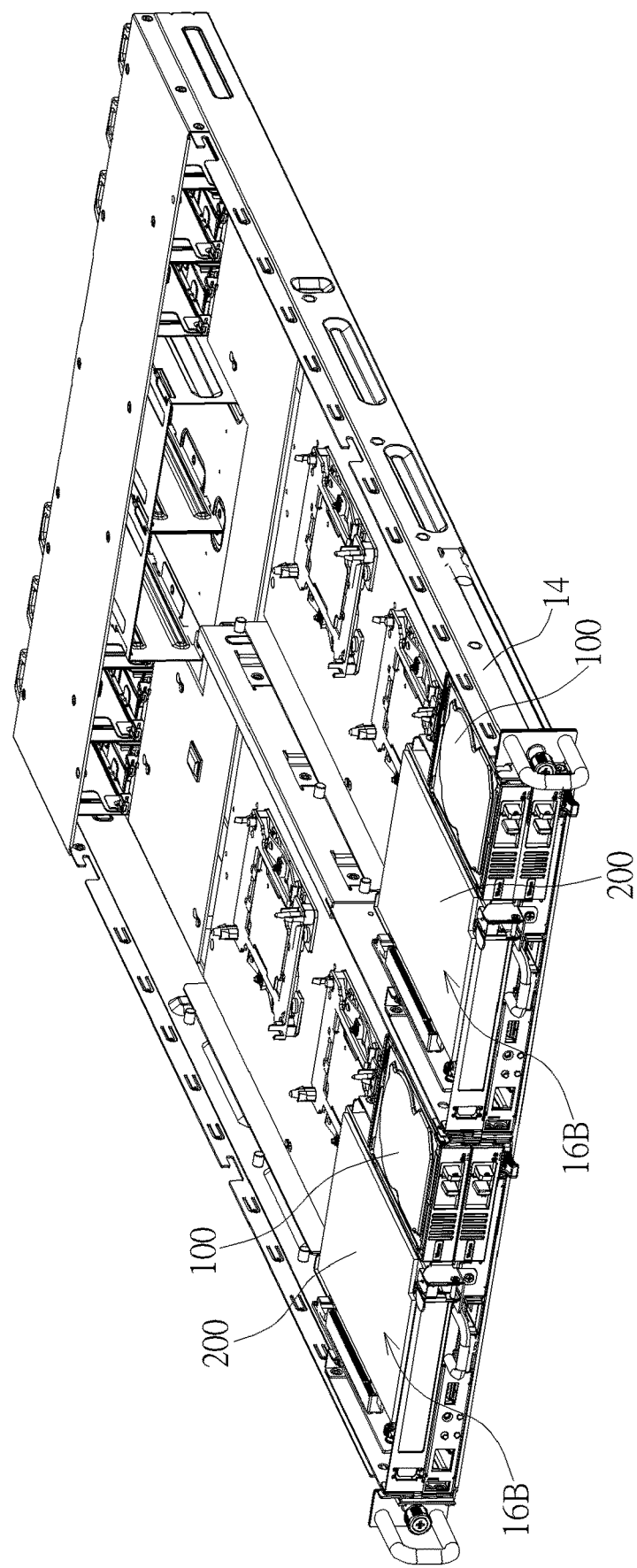
FIG. 4 is a diagram of a detachable carrier according to a second embodiment of the present disclosure.

Please refer to FIG. 3 and FIG. 4. FIG. 3 is a diagram of the detachable carrier 16A according to a first embodiment of the present disclosure. FIG. 4 is a diagram of the detachable carrier 16B according to a second embodiment of the present disclosure. The detachable carrier 16A can include two supporters. The right-side supporter can support two electronic devices (such as the hard disk 100) stacked in the vertical direction. The left-side supporter can support two electronic devices (such as the hard disk 100) arranged in the lateral direction. The detachable carrier 16A can accommodate four hard disks 100. In addition, the detachable carrier 16B can include two supporters. The right-side supporter can support two electronic devices (such as the hard disk 100) stacked in the vertical direction. The left-side supporter can support an electronic device (such as the interface card 200), and the electronic device can be PCI Express. The server apparatus 10 may accommodate a plurality of detachable carriers 16A, or a plurality of detachable carriers 16B, or the plurality of detachable carriers 16A and 16B.

Figure 5:
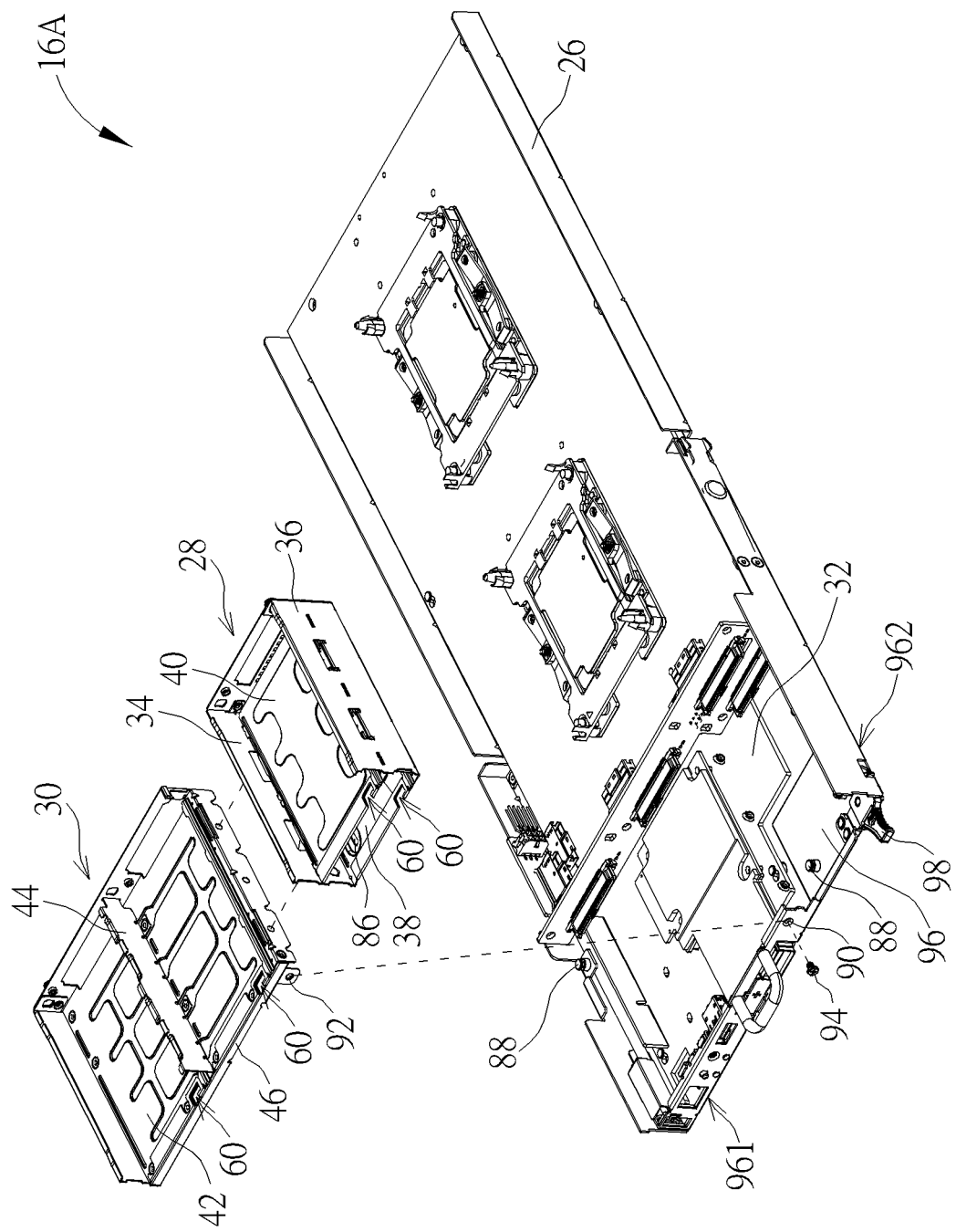
FIG. 5 is an exploded diagram of the detachable carrier according to the first embodiment of the present disclosure.
Figure 6:
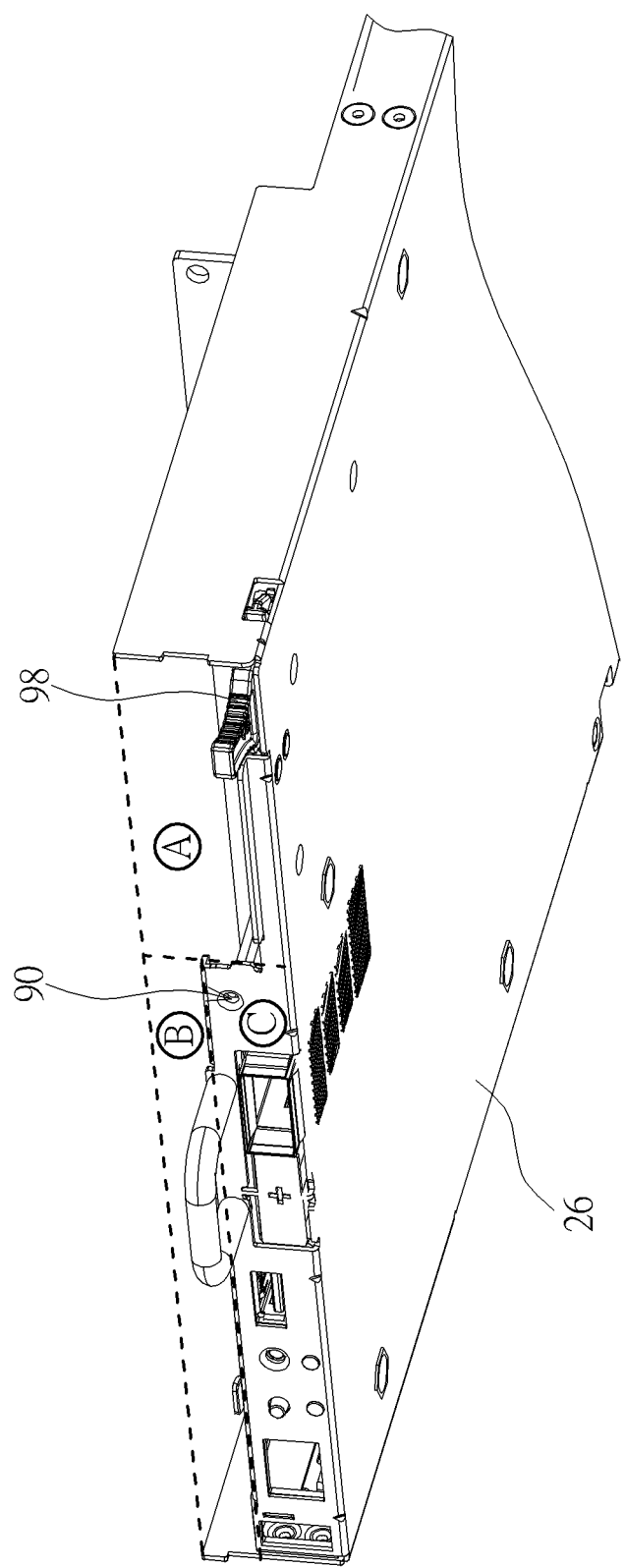
FIG. 6 is another view of a substrate according to the first embodiment of the present disclosure.
Figure 7:
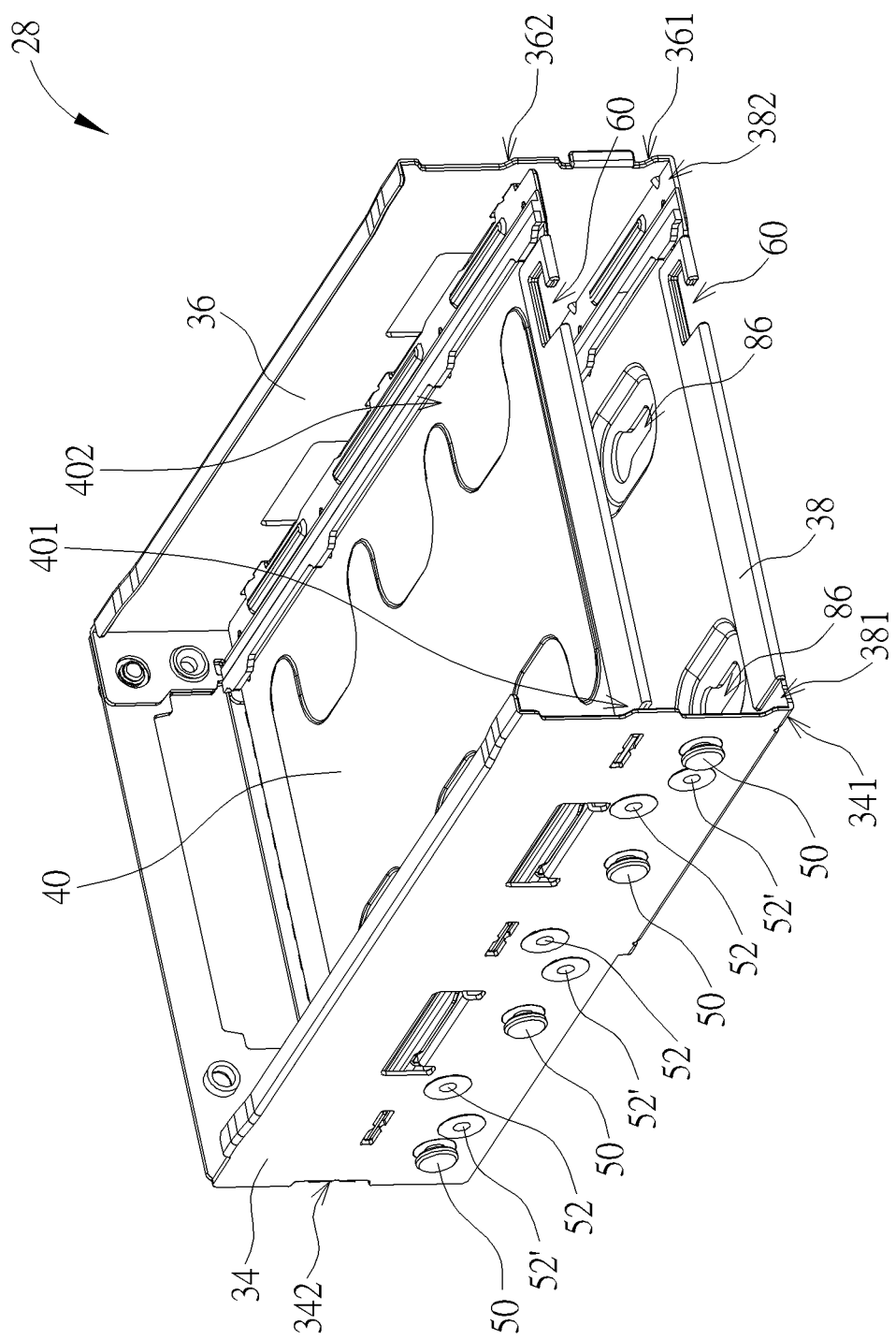
FIG. 7 is another view of a first supporter according to the first embodiment of the present disclosure.
Figure 8:
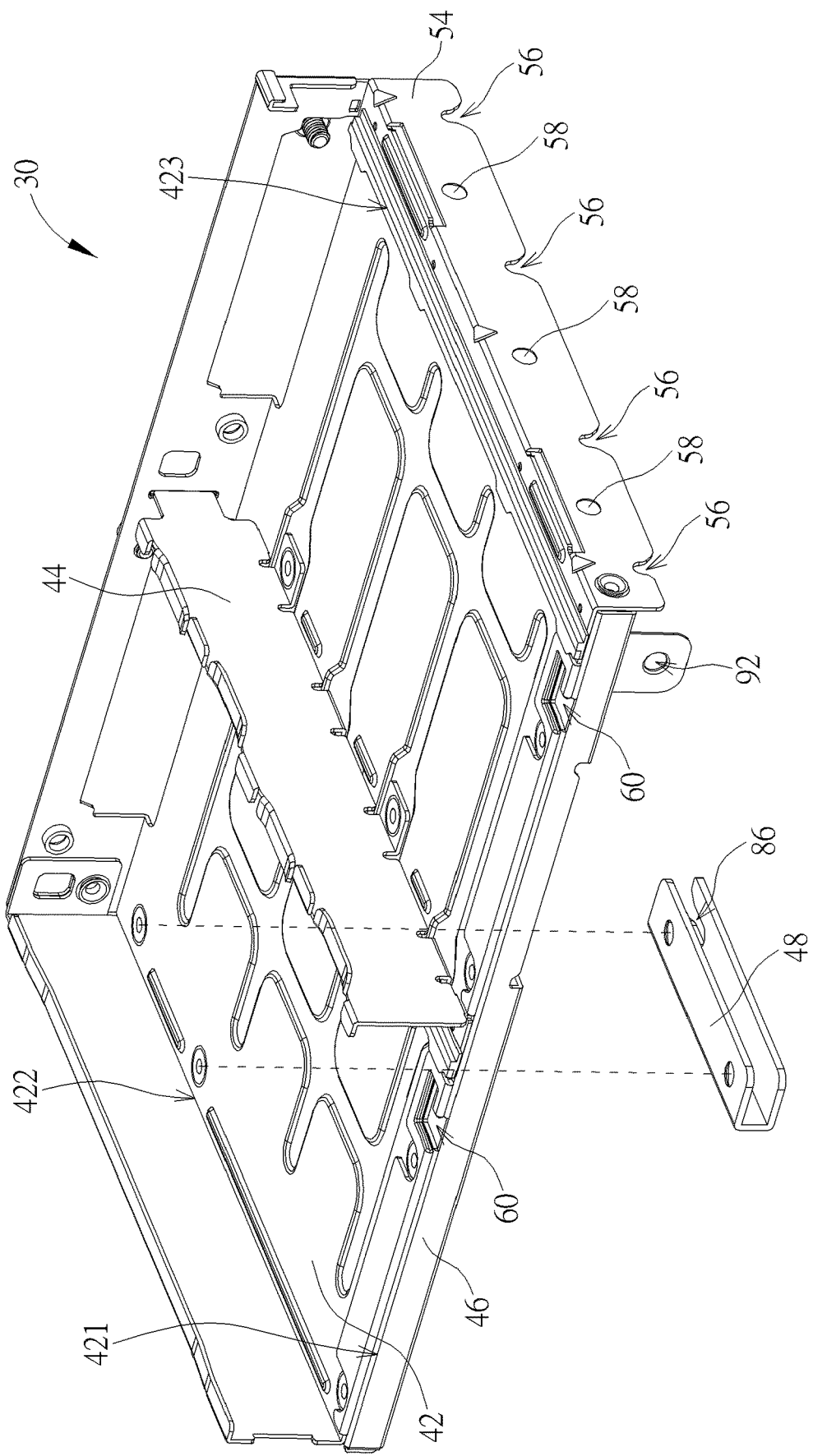
FIG. 8 is a diagram of a second supporter according to the first embodiment of the present disclosure.
Figure 9:
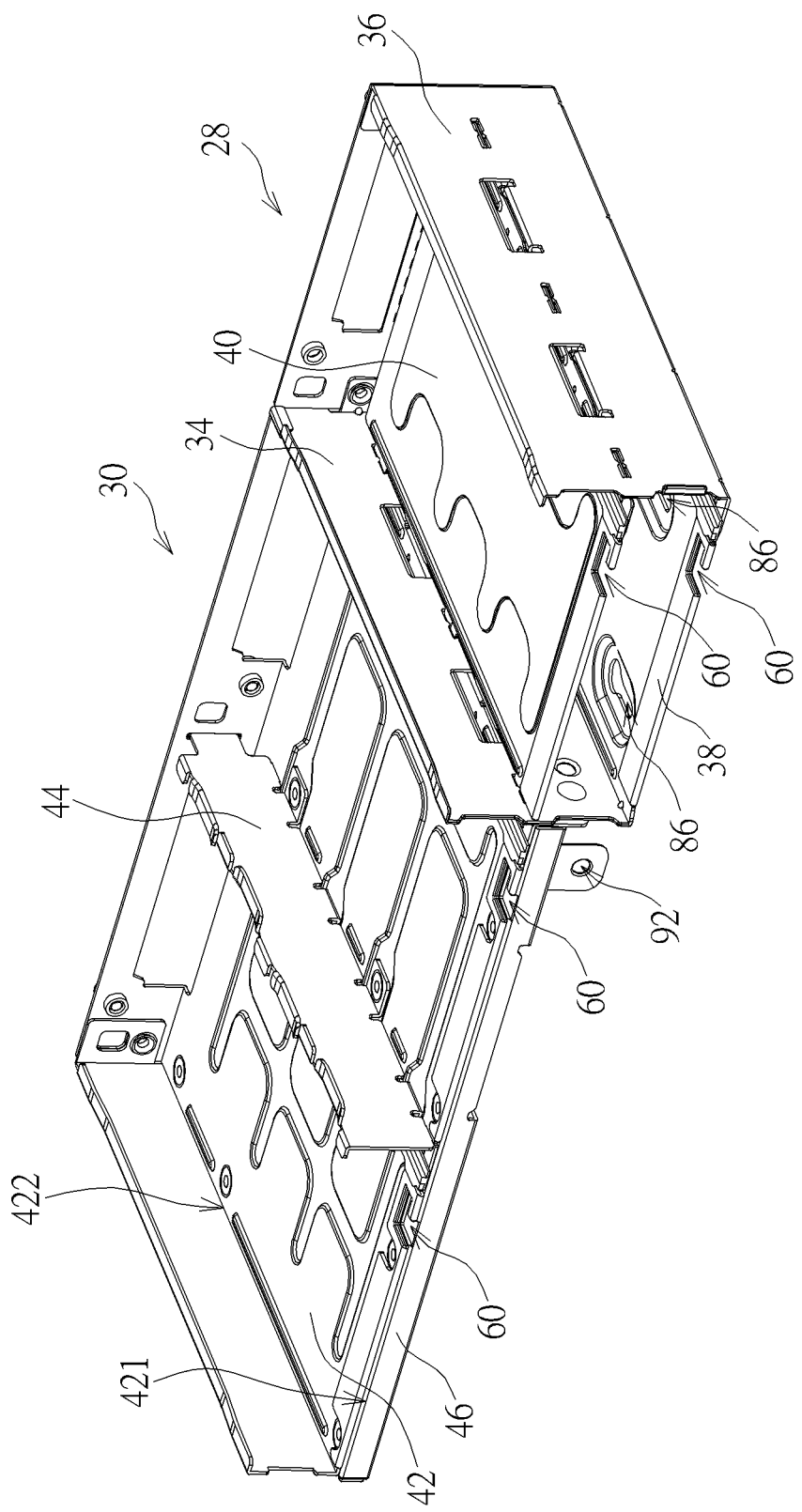
FIG. 9 is an assembly diagram of the first supporter and the second supporter according to the first embodiment of the present disclosure.

Please refer to FIG. 5 to FIG. 9. FIG. 5 is an exploded diagram of the detachable carrier 16A according to the first embodiment of the present disclosure. FIG. 6 is another view of a substrate 26 according to the first embodiment of the present disclosure. FIG. 7 is another view of a first supporter 28 according to the first embodiment of the present disclosure. FIG. 8 is a diagram of a second supporter 30 according to the first embodiment of the present disclosure. FIG. 9 is an assembly diagram of the first supporter 28 and the second supporter 30 according to the first embodiment of the present disclosure. The detachable carrier 16A can include the substrate 26, the first supporter 28 and the second supporter 30. The substrate 26 can have a first region A, a second region B and a third region C. The second region B can be positioned above the third region C, and the first region A can be disposed adjacent to the second region B and the third region C. The first supporter 28 can be disposed on the first region A in a detachable manner, and the second supporter 30 can be disposed on the second region B in the detachable manner. A circuit board 32 of the detachable carrier 16A can be positioned inside the substrate 26 and disposed on the third region C. The first supporter 28 and the second supporter 30 can be used to respectively support the electronic devices according to design demand.

The first supporter 28 can include a first wall portion 34, a second wall portion 36, a first base portion 38 and a second base portion 40. The first wall portion 34 and the second wall portion 36 can be arranged in parallel. A first lateral edge 381 of the first base portion 38 can be connected to a bottom edge 341 of the first wall portion 34. A second lateral edge 382 of the first base portion 38 can be connected to a bottom edge 361 of the second wall portion 36. A first lateral edge 401 of the second base portion 40 can be connected to a middle 342 of the first wall portion 34. A second lateral edge 402 of the second base portion 40 can be connected to a middle 362 of the second wall portion 36. Therefore, the first supporter can have two accommodating ranges arranged in the vertical direction. The two electronic devices (such as the hard disk 100) can be respectively disposed on the first base portion 38 and the second base portion 40.

Further, the second supporter 30 can include a holding component 42, an isolating component 44, a shielding component 46 and a locking component 48. The isolating component 44 can be disposed on an upper surface of the holding component 42 to form several accommodating ranges, and the two electronic device (such as the hard disk 100) can be respectively disposed on the accommodating ranges of the holding component 42 in the detachable manner. The shielding component 46 can be disposed on a front edge 421 of the holding component 42. When the second supporter 30 is disposed on the second region B, the shielding component 46 can be used to cover a gap formed between the holding component 42 and the substrate 26. The locking component 48 can be disposed on a lateral edge 422 of the holding component 42 far from the first supporter 28, and used to lock the substrate 26.

The first supporter 28 can dispose at least one guiding pin 50 and at least one first mounting hole portion 52 on the first wall portion 34. The second supporter 30 can include a bridging structure 54 formed on a lateral edge 423 of the holding component 42, and the bridging structure 54 can include at least one guiding slot portion 56 and at least one second mounting hole portion 58. The guiding pin 50 can be inserted into the guiding slot portion 56 to align the first mounting hole portion 52 with the second mounting hole portion 58, and a mounting component can pass through the first mounting hole portion 52 and the second mounting hole portion 58 to connect the first supporter 28 with a side of the second supporter 30. As shown in FIG. 7, because the electronic device (such as the hard disk 100) supported by the second supporter 30 is heavy, a distance between the first mounting hole portion 52 and the bottom edge 341 of the first wall portion 34 can be preferably greater than a distance between the guiding pin 50 and the bottom edge 341 of the first wall portion 34, so as to provide preferred connection strength for the second supporter 30 and ensure structural stability of the detachable carrier 16A.

The first supporter 28 can further include a first engaging structure 86 disposed on the first base portion 38, and the substrate 26 can include a second engaging structure 88 disposed on the first region A. In the embodiment, the first engaging structure 86 can be an engaging slot and the second engaging structure 88 can be an engaging pin; however, an actual application of the first engaging structure 86 and the second engaging structure 88 is not limited to the above-mentioned embodiment shown in the figures. The first engaging structure 86 may be the engaging slot having a wide front part and a narrow rear part. The engaging pin can be inserted into the engaging slot through the wide front part, and then moved to the narrow rear part of the engaging slot. An upper part of the engaging pin has dimensions greater than dimensions of the narrow rear part, so that the first engaging structure 86 can be tightly assembled with the second engaging structure 88 for preventing the first supporter 28 and the substrate 26 from separation. The second supporter 30 may include the first engaging structure 86 disposed on the locking component 48, and the substrate 26 may include the second engaging structure 88 disposed on the third region C. Assembly of the first engaging structure 86 and the second engaging structure 88 can constrain a relative movement between the second supporter 30 and the substrate 26.

The substrate 26 can further include a first penetrating hole structure 90, and the second supporter 30 can further include a second penetrating hole structure 92. When the second supporter 30 is assembled with the substrate 26, the first penetrating hole structure 90 can align with the second penetrating hole structure 92, and a fixing component 94 can pass through the first penetrating hole structure 90 and the second penetrating hole structure 92 to fix the second supporter 30 on the substrate 26 tightly. The substrate 26 qcan include a main body 96 and a hooking component 98. The main body 96 may contain the first region A, the second region B and the third region C. The second engaging structure 88 can be disposed on an inner surface of the main body 96, and the first penetrating hole structure 90 can be disposed on a wall surface of a front edge 961 of the main body 96. The hooking component 98 can be disposed on a side 962 of the main body 96 in a rotatable manner. When the substrate 26 is assembled with the base 14, the hooking component 98 can pass through holes formed on the main body 96 and the base 14 for constraining a relative movement between the substrate 26 and the base 14.

Figure 10:
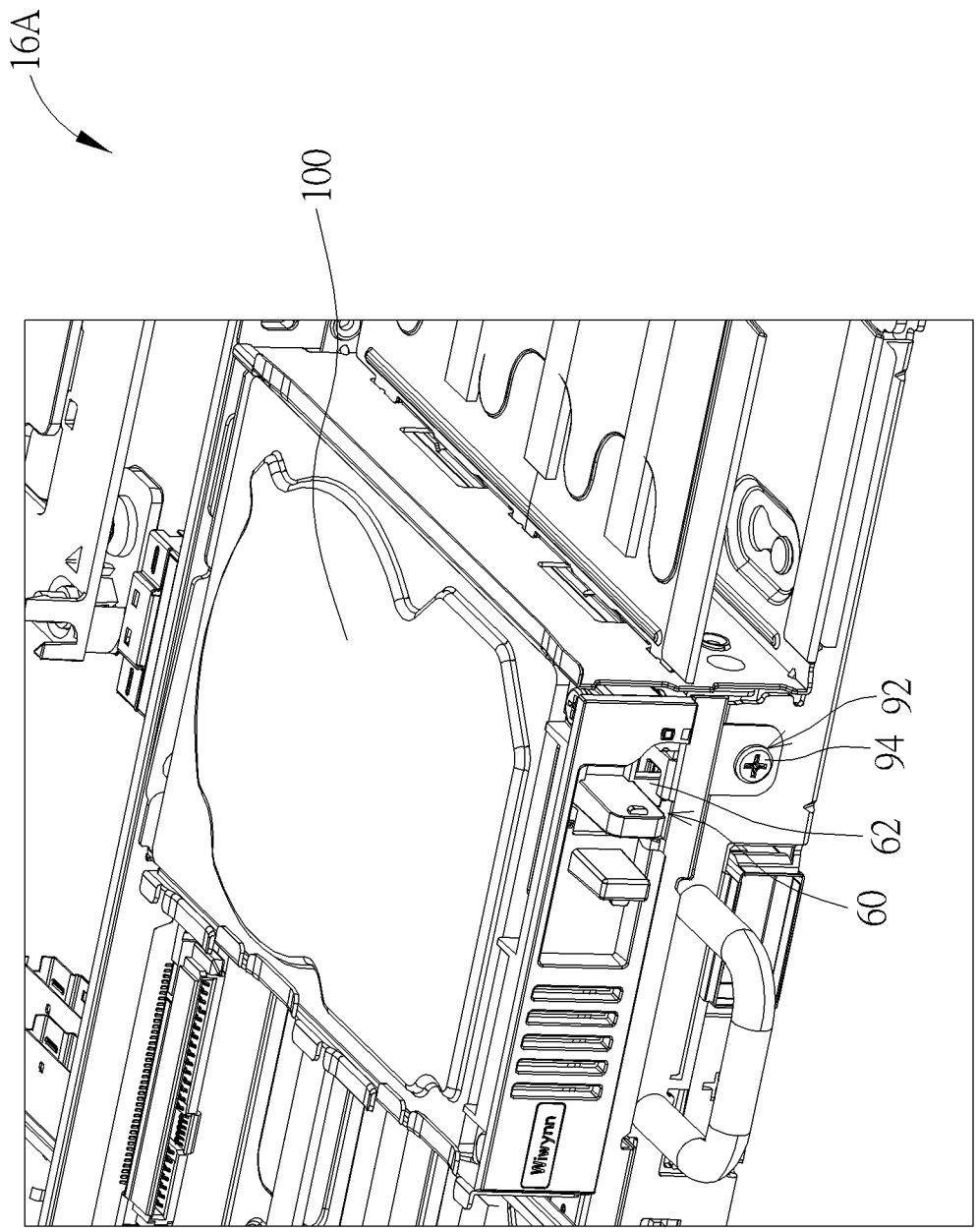
FIG. 10 to FIG. 12 are diagrams of the detachable carrier and the hard disk in different operation modes according to the embodiment of the present disclosure.
Figure 11:
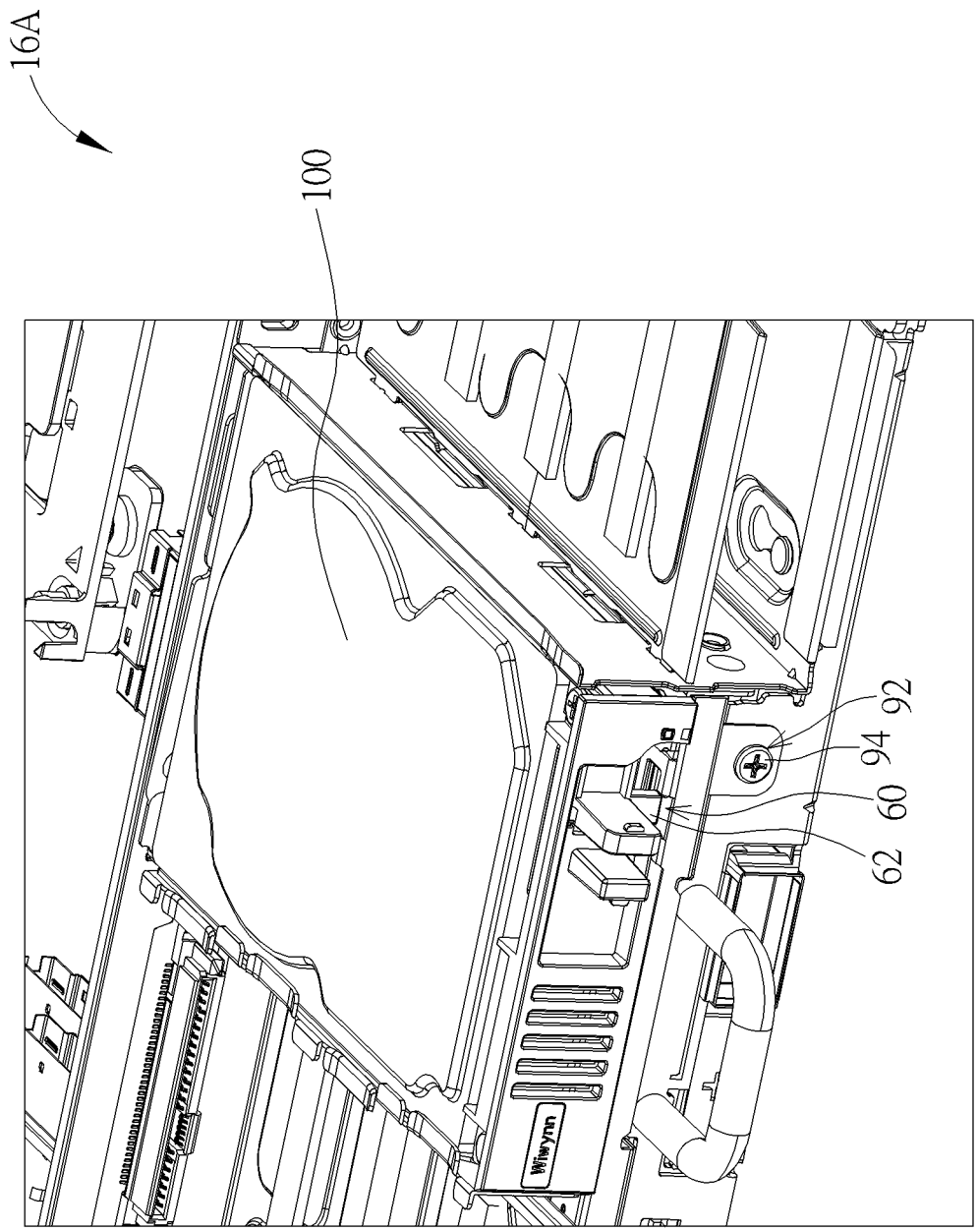
Figure 12:
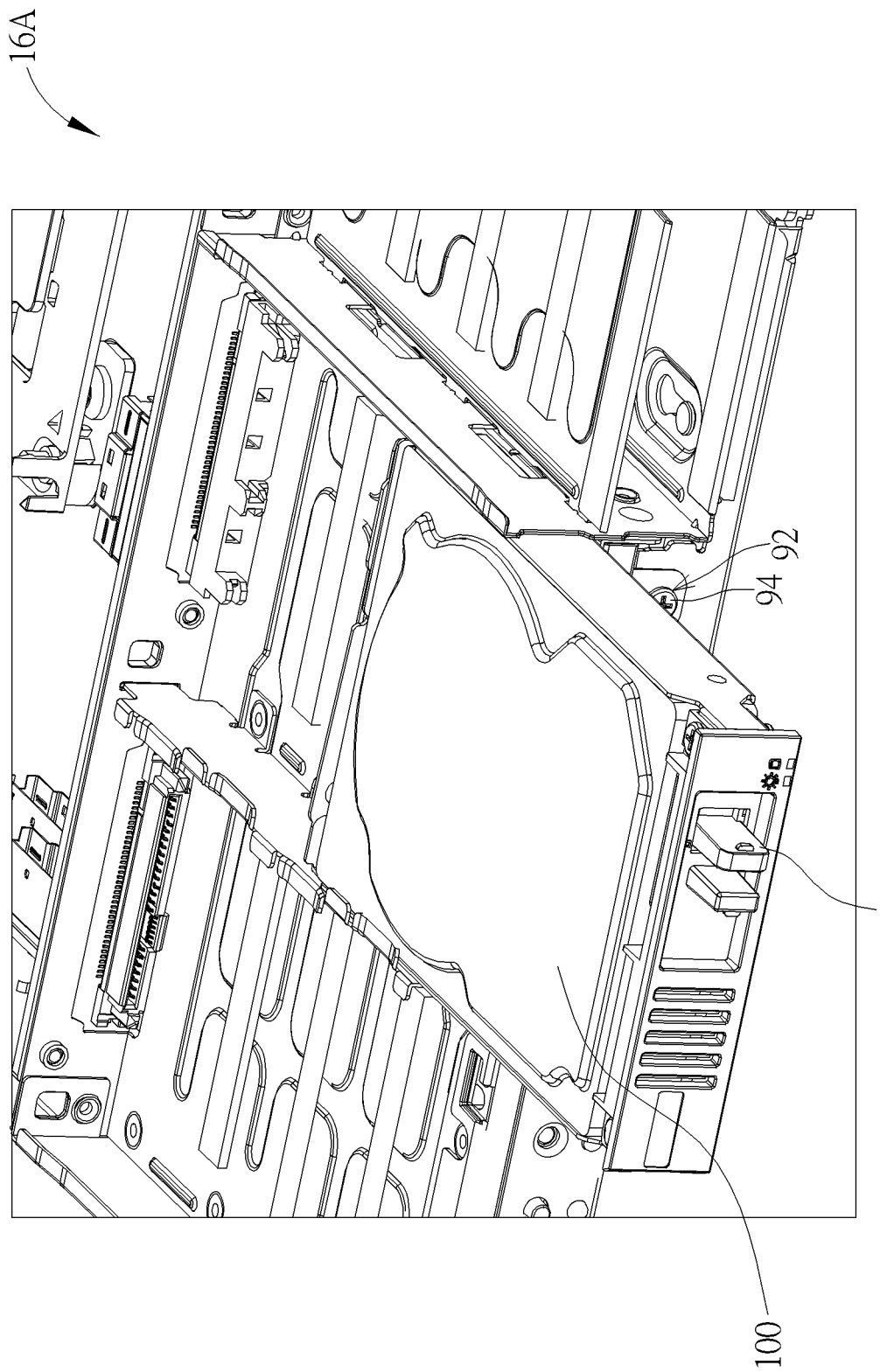

Please refer to FIG. 7 to FIG. 12. FIG. 10 to FIG. 12 are diagrams of the detachable carrier 16A and the hard disk 100 in different operation modes according to the embodiment of the present disclosure. Each of the first base portion 38, the second base portion 40 and the holding component 42 can include a constraining slot structure 60. The hard disk 100 can include a constraining latch 62, and the constraining latch 62 can be freely moved between a first position and a second position. As the hard disk 100 is disposed on the first supporter 28 or the second supporter 30, the constraining latch 62 can be positioned at the first position shown in FIG. 10 and engaged inside the constraining slot structure 60, so the hard disk 100 cannot be removed. As the constraining latch 62 is moved to the second position shown in FIG. 11, the constraining latch 62 can be released and not constrained by the constraining slot structure 60. The hard disk 100 can be pulled and removed from the detachable carrier 16A, as shown in FIG. 12; that is to say, any inactive hard disk 100 can be removed from the detachable carrier 16A individually. The user does not replace the detachable carrier, but can easily remove the failed hard disks 100 from the detachable carrier 16A according to damage situations.

Figure 13:
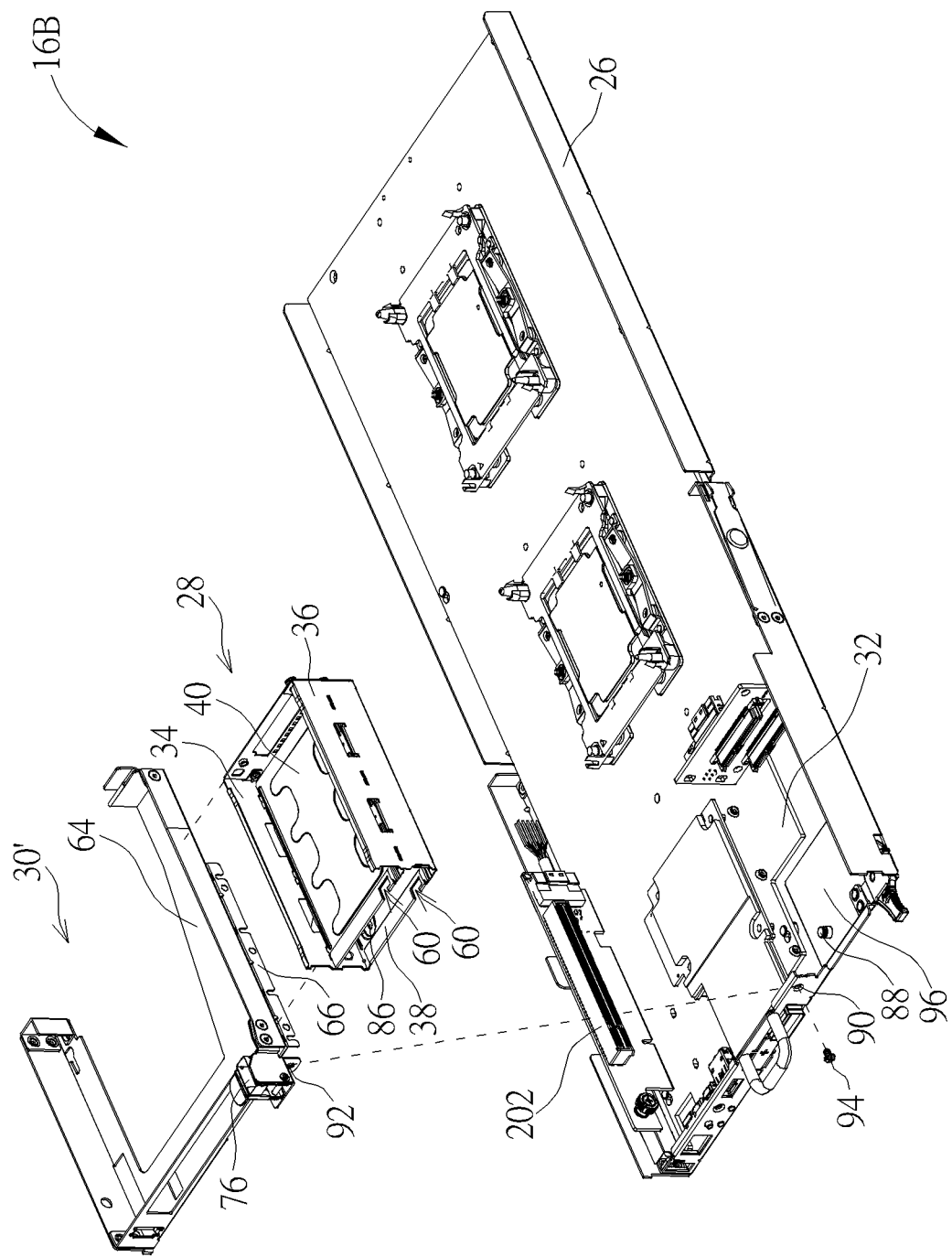
FIG. 13 is an exploded diagram of the detachable carrier according to the second embodiment of the present disclosure.
Figure 14:
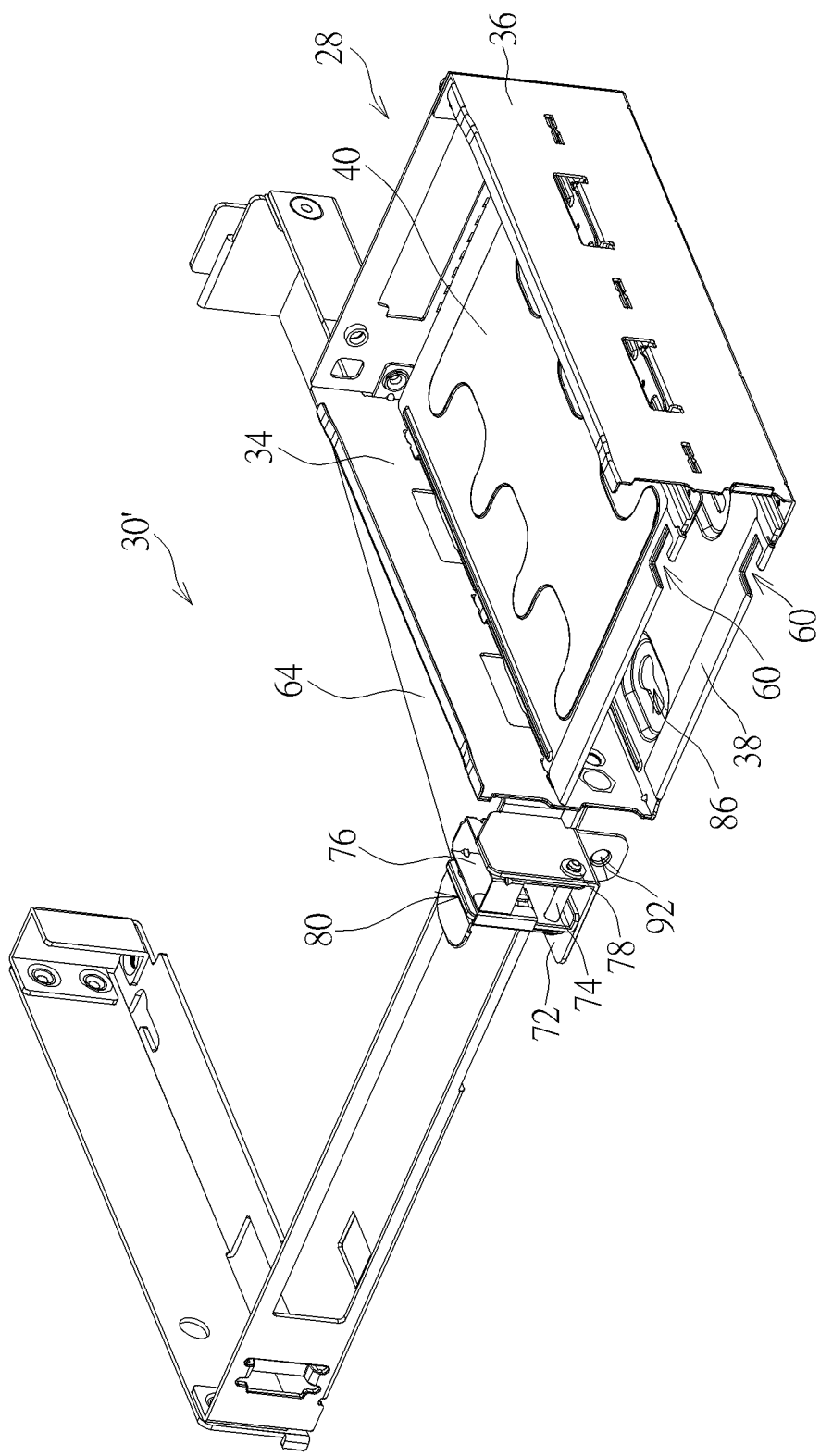
FIG. 14 is an assembly diagram of the first supporter and the second supporter according to the second embodiment of the present disclosure.
Figure 15:
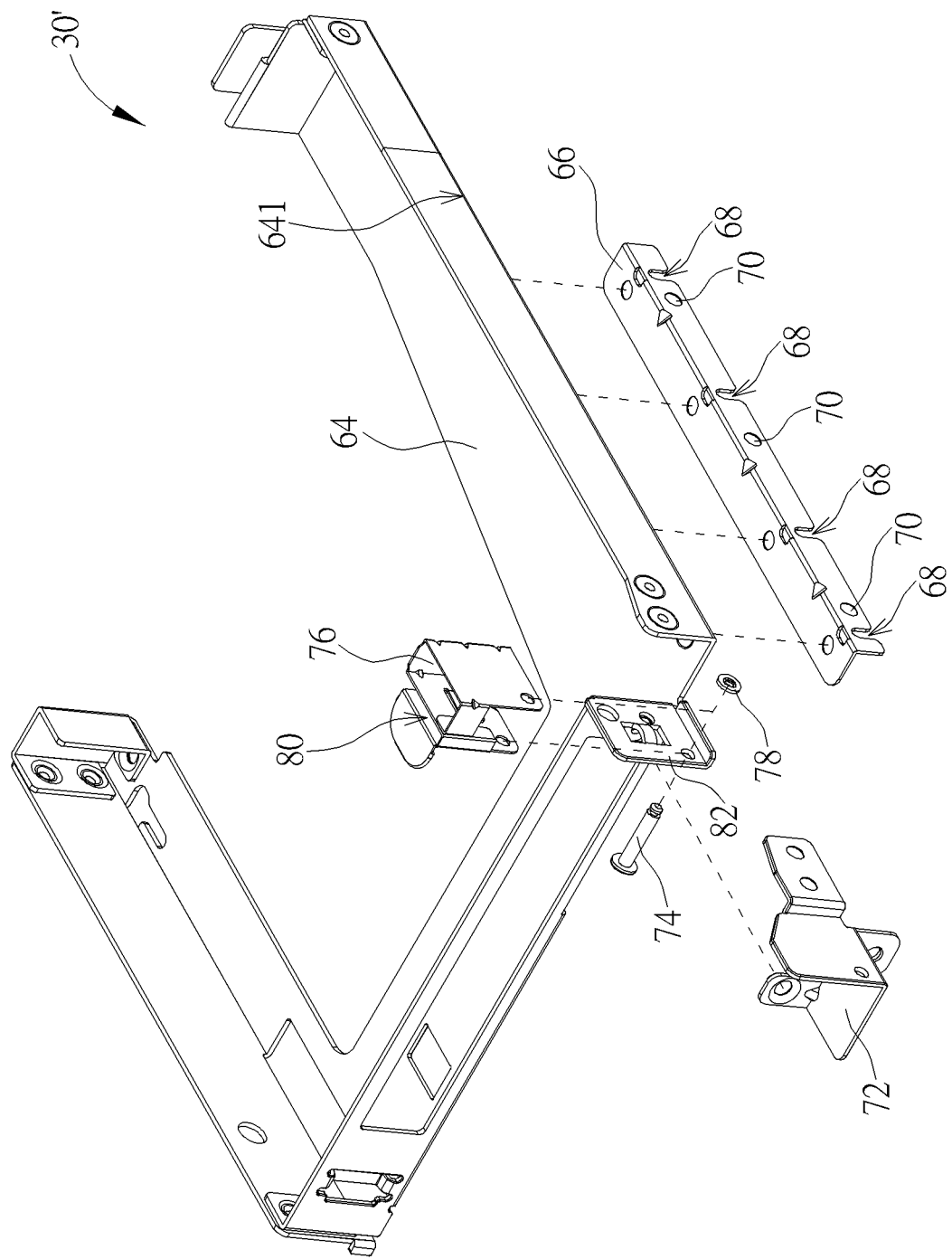
FIG. 15 is an exploded diagram of the second supporter according to the second embodiment of the present disclosure.

Please refer to FIG. 13 to FIG. 15. FIG. 13 is an exploded diagram of the detachable carrier 16B according to the second embodiment of the present disclosure. FIG. 14 is an assembly diagram of the first supporter 28 and the second supporter 30' according to the second embodiment of the present disclosure. FIG. 15 is an exploded diagram of the second supporter 30' according to the second embodiment of the present disclosure. In the second embodiment, elements having the same numerals as one of the first embodiment have the same structures and functions, and a detailed description is omitted herein for simplicity. The detachable carrier 16B can include the substrate 26, the first supporter 28 and the second supporter 30'. The second supporter 30' can include a holding component 64 and a positioning component 66. The positioning component 66 can be disposed on a lateral edge 641 of the holding component 64 adjacent to the first supporter 28. The positioning component 66 can have at least one guiding slot portion 68 and at least one second mounting hole portion 70. The guiding pin 50 of the first supporter 28 can be inserted into the guiding slot portion 68 to align the first mounting hole portion 52' with the second mounting hole portion 70, as shown in FIG. 7. The mounting component can pass through the first mounting hole portion 52' and the second mounting hole portion 70 to connect the first supporter 28 with the side of the second supporter 30'.

The second supporter 30' is mainly used to support the interface card 200, so that the first mounting hole portion 52' of the second embodiment can be close to the guiding pin 50 because the interface card 200 is light and sufficiently supported by the low strength second supporter 30'. The first supporter 28 is an element common to the detachable carriers 16A and to the detachable carrier 16B. The first supporter 28 can include the first mounting hole portion 52 and the first mounting hole portion 52' respectively applied to the second supporter 30 and the second supporter 30'. The present disclosure may adjust dimensions of the bridging structure 54 and/or the positioning component 66, so that both the second mounting hole portion 58 and the second mounting hole portion 70 can be applied to the same first mounting hole portion on the first supporter 28 when the first supporter 28 is connected to the second supporter 30 or the second supporter 30'.

Figure 16:
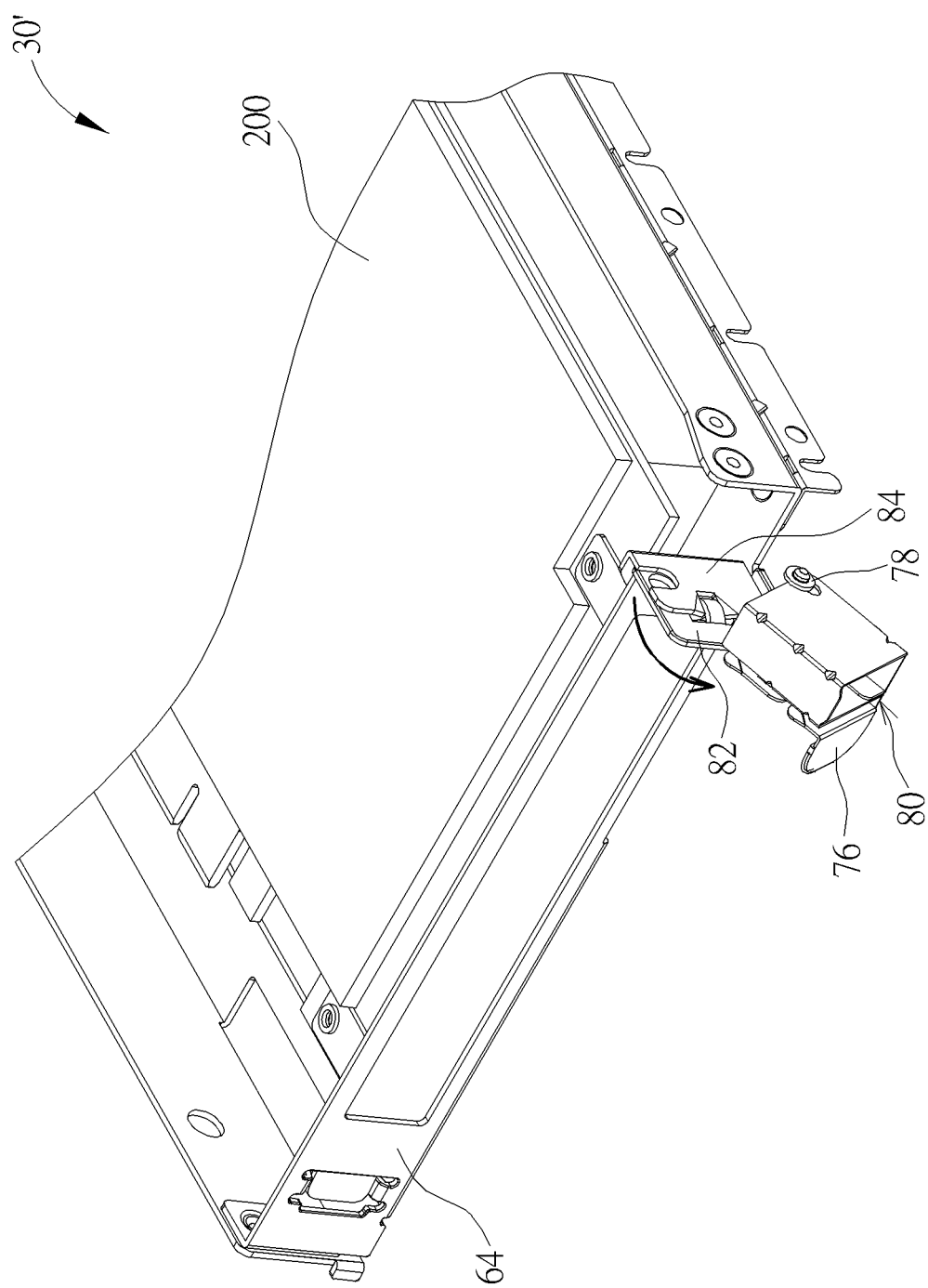
FIG. 16 and FIG. 17 are diagrams of an interface card and the second supporter in different operation modes according to the second embodiment of the present disclosure.
Figure 17:
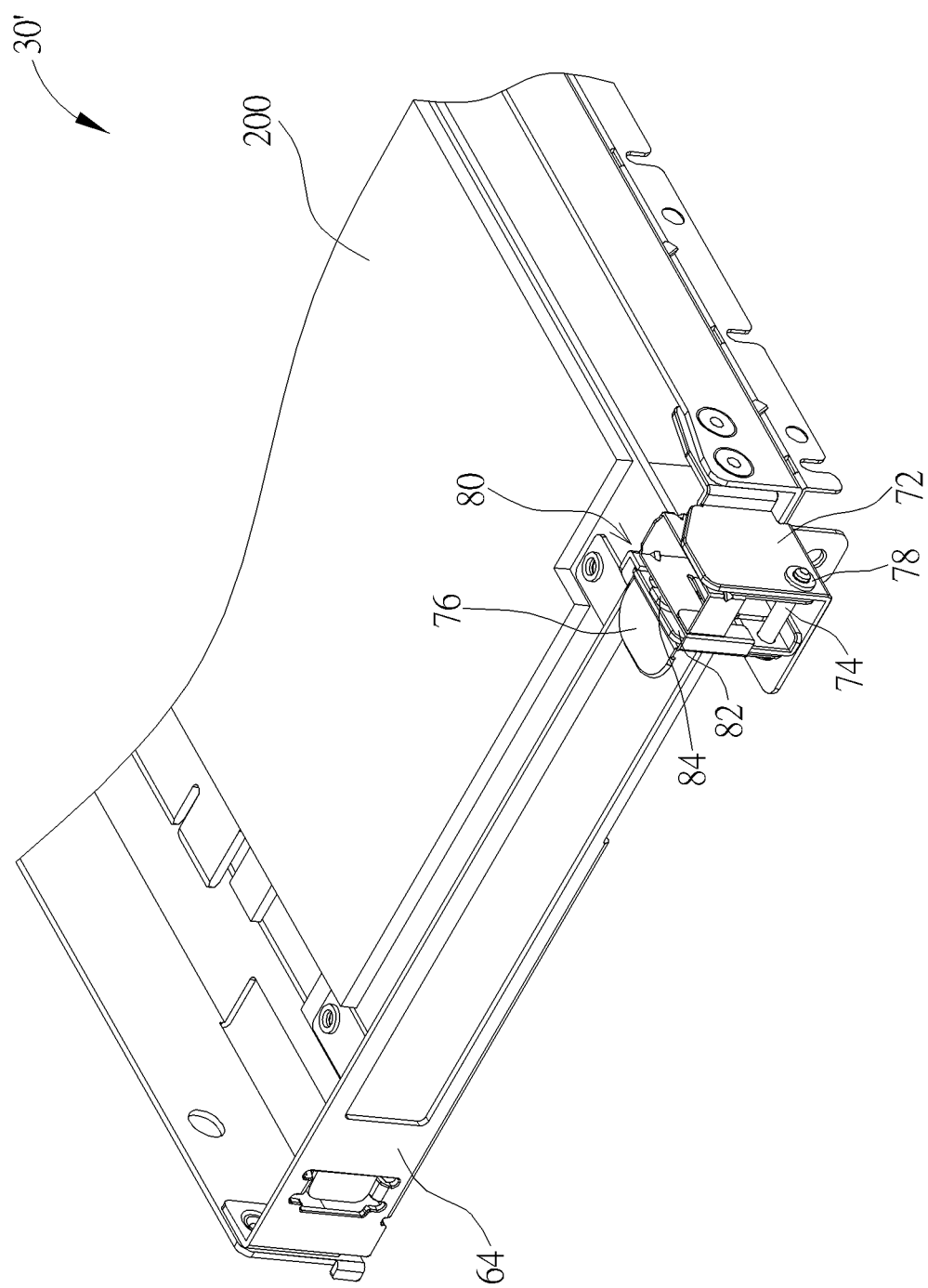

Moreover, the second supporter 30' can further include a bracket 72, an axle 74 and a latching component 76. The bracket 72 can be disposed on the holding component 64. The axle 74 can pass through the holding component 64 and the bracket 72, and be fixed on the bracket 72 via a fixing ring 78. The latching component 76 can be rotatably disposed on the bracket 72 by the axle 74. The latching component 76 can include a clipping portion 80, and the clipping portion 80 may be a narrow U-typed structure. Please refer to FIG. 16 and FIG. 17, which are diagrams of the interface card 200 and the second supporter 30' in different operation modes according to the second embodiment of the present disclosure. When the interface card 200 is disposed on the second supporter 30', a first stretching portion 82 of the holding component 64 can abut against or close to a second stretching portion 84 of the interface card 200. As shown in FIG. 16, the latching component 76 is rotated outwardly, and the clipping portion 80 can be far from the first stretching portion 82 and the second stretching portion 84; in the meantime, the interface card 200 can be freely removed from a connection socket 202 so as to be arbitrarily disassembled from the second supporter 30'. As shown in FIG. 17, the latching component 76 is rotated inwardly, and the first stretching portion 82 and the second stretching portion 84 can be clipped by the clipping portion 80 for constraining a movement of the interface card 200 relative to the holding component 64, so that the interface card 200 can be stably installed inside the second supporter 30'.

In conclusion, the server apparatus of the present disclosure has a detachable function. The plurality of detachable carriers can be disposed on the base of the server apparatus via a slide rail structure or a buckling structure. The detachable carrier can accommodate the electronic devices having the same type or different types. The user can disassemble the detachable carrier so that the electronic device inside the detachable carrier are removed simultaneously, or can remove one or some electronic devices from the detachable carrier without disassembling the detachable carrier from the base. The detachable carrier can accommodate the electronic devices having the same type, such as the hard disks, or can accommodate the electronic devices having different types, such as the hard disks and the interface card. The substrate and the first supporter of the detachable carrier are common elements applied to install the hard disk in the first embodiment and the second embodiment, and the second supporter of the detachable carrier used to install the hard disk or the interface card may have structural difference between the first embodiment and the second embodiment.

In the present disclosure, the second supporter in different embodiments can be matched with the substrate and the first supporter having the common specification. The user can replace and select a type of the second supporter in accordance with actual demand to dispose any kind of electronic devices on the detachable carrier, for an aim of cost reduction. The detachable carrier and the server apparatus of the present disclosure have advantages of simple structure and easy assembly. The user can easily remove and replace the electronic device and the detachable carrier without additional tools, so as to effectively increase efficiency of assembly and disassembly and conform to a demand for consumer marketing campaigns.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A detachable carrier comprising:
a substrate, having a first region and a second region adjacent to each other;
a first supporter disposed on the first region in a separable manner, the first supporter having an upper chamber and a lower chamber; and
a second supporter disposed on the second region in a separable manner, a lateral edge of the second supporter being directly connected to a lateral edge of the first supporter for aligning the second supporter with one of the upper chamber and the lower chamber;
wherein the upper chamber and the lower chamber of the first supporter and the second supporter are configured to respectively support a plurality of electronic devices;
wherein the second supporter comprises a holding component and an isolating component, the isolating component is disposed on the holding component to form a plurality of accommodating ranges, some of the plurality of electronic devices are respectively disposed on the plurality of accommodating ranges in a detachable manner.

2. The detachable carrier of claim 1, wherein the substrate further has a third region disposed under the second region and adjacent to the first region.

3. The detachable carrier of claim 1, wherein the first supporter comprises a first wall portion, a second wall portion, a first base portion and a second base portion, a first lateral edge of the first base portion is connected to a bottom edge of the first wall portion, a second lateral edge of the first base portion is connected to a bottom edge of the second wall portion, a first lateral edge of the second base portion is connected to a middle of the first wall portion, and a second lateral edge of the second base portion is connected to a middle of the second wall portion.

4. The detachable carrier of claim 3, wherein the first base portion and the second base portion respectively comprises a constraining slot structure, some of the electronic devices respectively comprises a constraining latch, the constraining latch is slidably disposed inside the constraining slot structure, and the foresaid electronic devices are respectively disposed on the first base portion and the second base portion in a detachable manner.

5. The detachable carrier of claim 3, wherein the second supporter comprises a holding component and a positioning component, the positioning component is disposed on a lateral edge of the holding component adjacent to the first supporter, the first supporter comprises a guiding pin and a first mounting hole portion, the positioning component comprises a guiding slot portion and a second mounting hole portion, the guiding pin is inserted into the guiding slot portion to align the first mounting hole portion with the second mounting hole portion.

6. The detachable carrier of claim 5, wherein the second supporter further comprises a bracket, an axle and a latching component, the bracket is disposed on the holding component, and the latching component is rotatably disposed on the bracket via the axle.

7. The detachable carrier of claim 6, wherein the latching component comprises a clipping portion configured to clip a first stretching portion of the holding component and a second stretching portion of the electronic device for constraining a movement of the electronic device relative to the holding component.

8. The detachable carrier of claim 1, wherein the first supporter comprises a guiding pin and a first mounting hole portion, a bridging structure of the holding component comprises a guiding slot portion and a second mounting hole portion, the guiding pin is inserted into the guiding slot portion to align the first mounting hole portion with the second mounting hole portion.

9. The detachable carrier of claim 1, wherein a lateral edge of the holding component is connected to the first supporter, and the second supporter further comprises a shielding component disposed a front edge of the holding component connected to the lateral edge.

10. The detachable carrier of claim 1, wherein the second supporter further comprises a locking component disposed on a lateral edge of the holding component far from the first supporter and configured to lock the substrate.

11. The detachable carrier of claim 1, wherein the holding component comprises a constraining slot structure, some of the said electronic devices respectively comprises a constraining latch, the constraining latch is slidably disposed inside the constraining slot structure, and some of the said electronic devices are respectively disposed on the holding component in the detachable manner.

12. The detachable carrier of claim 1, wherein the substrate further comprises a main body and a hooking component, the main body contains the first region and the second region, the hooking component is rotatably disposed on the main body, the hooking component is hooked with a base of a server apparatus for constraint when the detachable carrier is disposed on the base.

13. The detachable carrier of claim 1, wherein the substrate further comprises a second engaging structure and a first penetrating hole structure, the second engaging structure is disposed on the first region, the first penetrating hole structure is disposed on a front edge of a main body of the substrate, the first supporter comprises a first engaging structure configured to movably engage with the second engaging structure for disposing the first supporter on the first region in a detachable manner, the second supporter comprises a second penetrating hole structure configured to assemble with the first penetrating hole structure via a fixing component for disposing the second supporter on the second region in a detachable manner.

14. A server apparatus movably disposed on a rack, the server apparatus comprising:
a base having a baffle, an accommodating space of the base being divided into a plurality of carrying areas via the baffle; and
a plurality of detachable carriers respectively disposed on the plurality of carrying areas, each detachable carrier comprising:
a substrate, having a first region and a second region adjacent to each other, the substrate comprising a second engaging structure and a first penetrating hole structure, the second engaging structure being disposed on the first region, and the first penetrating hole structure being disposed on a front edge of a main body of the substrate;
a first supporter comprising a first engaging structure configured to movably engage with the second engaging structure for disposing the first supporter on the first region in a detachable manner; and
a second supporter adjacent to the first supporter, the second supporter comprising a second penetrating hole structure configured to assemble with the first penetrating hole structure via a fixing component for disposing the second supporter on the second region in the detachable manner;

wherein the first supporter and the second supporter are configured to respectively support a plurality of electronic devices.

15. The server apparatus of claim 14, wherein the substrate further has a third region disposed under the second region and adjacent to the first region.

16. The server apparatus of claim 14, wherein the first supporter comprises a first wall portion, a second wall portion, a first base portion and a second base portion, a first lateral edge of the first base portion is connected to a bottom edge of the first wall portion, a second lateral edge of the first base portion is connected to a bottom edge of the second wall portion, a first lateral edge of the second base portion is connected to a middle of the first wall portion, and a second lateral edge of the second base portion is connected to a middle of the second wall portion.

17. The detachable carrier of claim 14, wherein the first supporter comprises a guiding pin and a first mounting hole portion, a bridging structure of the second supporter comprises a guiding slot portion and a second mounting hole portion, the guiding pin is inserted into the guiding slot portion to align the first mounting hole portion with the second mounting hole portion.

18. The detachable carrier of claim 14, wherein the second supporter comprises a holding component and a positioning component, the positioning component is disposed on a lateral edge of the holding component adjacent to the first supporter, the first supporter comprises a guiding pin and a first mounting hole portion, the positioning component comprises a guiding slot portion and a second mounting hole portion, the guiding pin is inserted into the guiding slot portion to align the first mounting hole portion with the second mounting hole portion.

19. The detachable carrier of claim 14, wherein the substrate further comprises a main body and a hooking component, the main body contains the first region and the second region, the hooking component is rotatably disposed on the main body and configured to hook the base.

\* \* \* \* \*